United States Patent
Wick et al.

(10) Patent No.: US 12,130,337 B2
(45) Date of Patent: Oct. 29, 2024

(54) METHOD FOR DETERMINING A STATE OF AT LEAST ONE CELL OF A BATTERY, AND DATA-PROCESSING SYSTEM

(71) Applicant: VOLKSWAGEN AKTIENGESELLSCHAFT, Wolfsburg (DE)

(72) Inventors: Christian Wick, Cremlingen (DE); Stephan Gloger, Berlin (DE); Sascha Beaury, Gifhorn (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 197 days.

(21) Appl. No.: 17/918,697

(22) PCT Filed: Apr. 12, 2021

(86) PCT No.: PCT/EP2021/059447
§ 371 (c)(1),
(2) Date: Oct. 13, 2022

(87) PCT Pub. No.: WO2021/209389
PCT Pub. Date: Oct. 21, 2021

(65) Prior Publication Data
US 2023/0143444 A1    May 11, 2023

(30) Foreign Application Priority Data
Apr. 17, 2020   (DE) ..................... 10 2020 110 466.9

(51) Int. Cl.
*G01R 31/396*   (2019.01)
*G01R 25/00*    (2006.01)
*G01R 31/3835*  (2019.01)

(52) U.S. Cl.
CPC ......... *G01R 31/396* (2019.01); *G01R 25/005* (2013.01); *G01R 31/3835* (2019.01)

(58) Field of Classification Search
CPC .......................... G01R 31/396; G01R 31/3835
See application file for complete search history.

(56) References Cited

U.S. PATENT DOCUMENTS

| 4,498,044 A | 2/1985 | Horn |
| 6,611,774 B1 * | 8/2003 | Zaccaria ............... H01M 10/46 702/65 |

(Continued)

FOREIGN PATENT DOCUMENTS

| CH | 652 215 A5 | 10/1985 |
| DE | 197 55 417 A1 | 7/1999 |

(Continued)

OTHER PUBLICATIONS

Search Report for German Patent Application No. 10 2020 110 466.9, dated Nov. 30, 2020.

(Continued)

*Primary Examiner* — Walter L Lindsay, Jr.
*Assistant Examiner* — Milton Gonzalez
(74) *Attorney, Agent, or Firm* — PEARL COHEN ZEDEK LATZER BARATZ LLP

(57) ABSTRACT

The invention relates to a method for determining a state of at least one cell of a battery, wherein the battery has a plurality of cells, which are connected in series with each other, the method comprising at least the following steps: a) applying an alternating current to the plurality of cells; b) measuring the alternating voltage produced thereby at at least a first cell and a second cell; c) analyzing a phase position of the measured alternating voltage of each cell; wherein a difference at least between a first phase position of a first alternating voltage measured at the first cell and a (Continued)

second phase position of a second alternating voltage measured at the second cell forms a conclusion about a difference between the states of at least the first cell and the second cell.

12 Claims, 5 Drawing Sheets

(56) References Cited

U.S. PATENT DOCUMENTS

| | | | |
|---|---|---|---|
| 2020/0256924 A1* | 8/2020 | Hoermaier | G01R 31/389 |
| 2023/0008384 A1* | 1/2023 | Zhang | G01R 31/3835 |
| 2023/0314529 A1* | 10/2023 | Matsukawa | H02J 7/0047 |
| | | | 324/430 |

FOREIGN PATENT DOCUMENTS

| | | |
|---|---|---|
| DE | 10220172 A1 | 11/2003 |
| DE | 10 2014 222 950 A1 | 5/2015 |
| DE | 10 2014 202 927 A1 | 8/2015 |
| DE | 10 2014 003325 A1 | 9/2015 |
| DE | 10 2015 103 561 A1 | 9/2015 |
| DE | 10 2015 203878 A1 | 9/2016 |
| DE | 10 2018 213 523 A1 | 2/2020 |
| DE | 10 2018 216 518 A1 | 3/2020 |
| EP | 0922963 A2 | 6/1999 |
| KR | 102 016 339 B1 | 8/2019 |
| WO | WO 2020/064932 A1 | 4/2020 |

OTHER PUBLICATIONS

Search Report for International Patent Application No. PCT/EP2021/059447, mailed Jul. 8, 2021.

* cited by examiner

METHOD FOR DETERMINING A STATE OF AT LEAST ONE CELL OF A BATTERY, AND DATA-PROCESSING SYSTEM

CROSS-REFERENCE TO RELATED APPLICATIONS

This application is a National Phase Application of PCT International Application No. PCT/EP2021/059447, International Filing Date Apr. 12, 2021, claiming priority of German Patent Application No. 10 2020 110 466.9, filed Apr. 17, 2020, which is hereby incorporated by reference.

FIELD OF THE INVENTION

The invention relates to a method for determining a state of a cell of a battery, especially a high-voltage battery. In particular, the method is aimed at determining a state of a cell, taking into account the states of other cells of the same battery.

BACKGROUND OF THE INVENTION

Such high-voltage batteries are used especially in motor vehicles for storing electric energy in order to power traction drives. Here, a battery is usually made up of a plurality of cells, wherein each cell has a terminal voltage of 1.5 to 4 Volts. The cells are, at least partially, connected in series, so that a traction voltage of 60 to 1500 volts of direct voltage is provided.

Before the backdrop of current and pending legislation, it is required to monitor the state of the battery or of the cells during operation of a motor vehicle. In particular, determining the state of the cells can effectuate an early failure detection and an early service detection, so that a failure of a cell or of the battery during operation can be avoided and the cell or the battery can be replaced in time.

Damage to a high-voltage battery, for example, from below, cannot be detected electronically. Consequently, the user of a motor vehicle cannot be warned of possible damage to the cells.

The so-called thermal propagation is only detected at a late point in time. Early detection or a direct temperature measurement of a defective cell in which the internal temperature rises before the cell ultimately starts to burn does not yet exist. It is possible that there will be future legislation requiring that the user receive an early warning of such a risk.

At the present time, the internal cell temperature cannot be measured in vehicles. Instead, the cell module temperature, that is to say, the temperature of a plurality of cells, is measured indirectly. This indirect measurement of the temperature of a cell by measuring the cell module temperature is disadvantageous since changes in the internal temperature of a cell are only detected after a considerable time delay.

One method for determining the internal cell temperature is so-called impedance spectroscopy. In impedance spectroscopy, a phase relationship between current and voltage is evaluated so as to ascertain the real portion or the imaginary portion of a cell resistance. This takes place in that the frequency response of an impressed current passes from very low frequencies (0.1 Hz) to high frequencies (10 kHz). This method is very time-consuming and a great deal of energy is withdrawn from the cell in order to impress the current. Moreover, interferences that are caused by the consumers of the motor vehicle have a strong effect and falsify the measured signal. The measured results of the voltage and the current are evaluated by complex algorithmics. In this context, a conclusion can then be drawn, for example, about the absolute value of the internal cell temperature. This method is very susceptible to interference and is only used under laboratory conditions nowadays.

German patent application DE 197 55 417 A1 discloses an evaluation circuit for determining complex impedances. It is used to analyze the properties of fluids.

German patent application DE 10 2014 222 950 A1 discloses a lithium-air battery.

German patent application DE 10 2014 202 927 A1 describes a method for operating a battery device. Here, a performance state of the individual cells is determined. The weakest cells are determined and deactivated so as to slow down their aging process that has resulted from use.

SUMMARY OF THE INVENTION

The objective of the present invention is to at least partially overcome the problems cited with regard to the state of the art. In particular, a method for a determining a state of a cell of a battery is to be proposed. In particular, this is to allow early detection of a damaged cell during operation of a motor vehicle and to reduce or prevent risk to the user of the motor vehicle.

A method having the features according to claim 1 contributes towards achieving these objectives. Advantageous refinements are the subject matter of the dependent claims. The features presented individually in the patent claims can be combined with each other in a technically meaningful manner and can be augmented by explanatory facts from the description and/or by details from the figures, whereby other embodiment variants of the invention are presented.

A method for determining a state of at least one cell of a battery is being proposed, wherein the battery has a plurality of cells, which are connected in series with each other. The method comprises at least the following steps:
  a) applying an alternating current to the plurality of cells;
  b) measuring the alternating voltage produced thereby at at least a first cell and a second cell;
  c) analyzing a phase position of the measured alternating voltage of each cell; wherein a difference at least between a first phase position of a first alternating voltage measured at the first cell and a second phase position of a second alternating voltage measured at the second cell forms a conclusion about a difference between the states of at least the first cell and the second cell.

The above-mentioned (not definitive) breakdown of the method steps into a) through c) is to serve mainly only for differentiation purposes and does not necessarily require any given sequence and/or dependency. The frequency of the individual method steps can also vary. By the same token, it is possible for method steps to at least partially overlap with each other in terms of time. Very preferably, method steps b) and c) take place during step a). Step c) can be conditional and, if applicable, can only be carried out if step b) indicates that the measured alternating voltages do not have any phase shift. In particular, steps a) through c) are carried out in the sequence indicated.

In particular, with the method described here, which can also be referred to as "differentially measuring impedance spectroscopy", only the difference between the imaginary portions of the cell resistances relative to each other are determined. In particular, here it is not the phase relationship between a current and a voltage that is evaluated, but rather only the phase position or phase relationship of the alternating voltages relative to each other that have been measured at the cells. Possible interferences of the current signal have an effect simultaneously and with the same magnitude on all of the cells of the battery or of the series-connected cells and are not measured here as a common mode portion. In the present method, exclusively changes in the imaginary portions of the cell resistances relative to each other are measured and evaluated.

According to step a), especially an alternating current, for example, with a frequency of more than 1 Hz (Hertz), especially between 1 Hz and 10 kHz, preferably between 10 Hz and 10 kHz, very preferably of 100 Hz, is impressed into the cells of the battery.

According to step b), the alternating voltage produced thereby is measured at the individual cells of the battery, especially at a selection of the cells or at all of the cells of the battery.

According to step c), the phase relationship of the measured alternating voltages relative to each other is evaluated, for example, electronically. In particular, the specific phase position of each measured alternating voltage is detected and compared to the phase positions of the other alternating voltages. The difference of the phase positions can be classified in terms of (retrievable and/or predefined) limit values, threshold values, acceptance ranges, empirical values, families of characteristics or the like, so as to draw a conclusion about the state of at least one of the tested cells. The conclusion can comprise a probability value for the necessity of a potential or pending failure of at least one cell, (existing or anticipated) damage of a cell, an (additional) need for service regarding at least one cell, etc. The analysis or evaluation can be carried out purely computationally using data processing means. They can then provide information about the conclusion.

In particular, within the scope of the method, exclusively the alternating voltages of the cells present at the cells are measured.

In particular, the frequency can have any desired value between 1 Hz and 10 kHz. In particular, the alternating current can have a constant or a changing frequency. In particular, the alternating current can also have just one period length.

In particular, the alternating voltages measured at the cells are each filtered through a bandpass filter and each signal thus generated is changed by an amplifier having a comparator. The signals changed by the amplifier having the comparator are each combined in a phase detector. A phase shift of the measured alternating voltages can be represented by a first output signal.

The bandpass filter can be used to detect the alternating voltage that is to be associated with the impressed alternating current and that is thus generated at the cell. Therefore, the bandpass filter especially allows the detection of an alternating voltage that has the frequency of the alternating current. In particular, direct voltage portions and alternating voltages of other frequencies are not detected or else they are masked.

The amplifier having the comparator especially supplies a changed signal that represents—as a square-wave signal—the alternating voltage that has been measured and filtered through the bandpass filter. If a phase shift relative to other alternating voltages is present, then this becomes clear through a shift of the square-wave signals along the time axis.

In particular, the signals changed by the amplifier having the comparator are represented as a second output signal, so that it is possible to represent which alternating voltage or alternating voltages have a phase shift relative to other alternating voltages.

As soon as the imaginary portions of the cell resistances differ and thus generate a phase shift of the alternating voltage measured at a cell, the first output signal especially generates a square-wave signal. This allows a conclusion to be drawn about a difference among the cells, for example, about a temperature rise at the start of a thermal propagation. The length of the square-wave signal in terms of time is especially proportional or equal to the magnitude of the difference, that is to say, for example, the temperature difference.

If the square-wave signal of the first output signal is measured or determined at the start of a trip by a motor vehicle in which especially all of the cell temperatures are the same, then it can be assumed that at least one cell is defective. A cause can be an instance of damage that had occurred at a previous point in time, for example, denting of the battery by a bollard underneath a vehicle or due to a severely aged cell.

If the absolute value of a cell temperature is measured near a cell, for example, by means of a temperature sensor, then the phase position of every single alternating voltage that can be identified on the second output signal can allow a conclusion to be drawn about the appertaining internal cell temperature. Subsequently, on the basis of this additional information, the SOC (state of charge of the cell and, if applicable, additionally of the battery) or the SOH (state of health, that is to say the ageing state of the cell) can be determined more precisely.

The output signals can be evaluated by an evaluation unit.

In particular, alternating voltages of all of the cells relative to each other can be measured, or else a circuit unit for determining the alternating voltage of the cell stack is used for a cell stack of a plurality of cells (for example, 6 or 12, etc.). This is especially advantageous for the structure of a high-voltage battery with cell modules or cell stacks since, as a rule, the cell stacks do not exceed a maximum voltage of 60 Volts.

The proposed method can especially be used to determine temperature differences between the cells, mechanical damage or significant ageing phenomena of individual cells.

The circuits needed to carry out the method can be integrated into a battery control or configured separately, for example, as an application-specific integrated circuit—ASIC.

In particular, the alternating voltages measured at the cells are each filtered through a bandpass filter and each signal thus generated is changed by an amplifier. The changed signals are (each) fed to a lock-in amplifier that is impinged with a reference voltage signal, wherein, for each measured alternating voltage, the (appertaining) lock-in amplifier outputs a direct voltage whose magnitude is proportional at least to a phase shift between the measured alternating voltage and the reference voltage signal.

The amplifier especially supplies a changed signal that represents—as a square-wave signal—the alternating voltage that has been measured and filtered through the bandpass filter.

The reference voltage signal is especially likewise a square-wave signal.

The reference voltage signal especially has the same frequency as the impressed alternating current.

A lock-in amplifier is especially an amplifier for measuring a weak electric alternating signal that is modulated with a reference signal whose frequency and phase are known.

The device has a narrow-band bandpass filter and it consequently improves the signal-to-noise ratio (SNR).

The two input signals of the (appertaining) lock-in amplifier, that is to say, the measured alternating voltage that was filtered in the bandpass filter and that was converted into a changed signal by means of an amplifier on the one hand, and the reference voltage signal on the other hand, are multiplied by each other in a mixer or multiplicator and subsequently integrated into a low-pass filter. The low-pass filter permits the masking of signals having higher frequencies that are generated when the input signals are multiplied.

The lock-in amplifier especially computes the cross-correlation between the changed signal and the reference voltage signal for a fixed phase shift between the changed signal of a cell and the reference voltage signal. The cross-correlation for signals of different frequencies is zero. If the frequency of the changed signal is thus different from that of the reference voltage signal, the lock-in amplifier does not supply an output signal. Only for the same frequencies does the cross-correlation yield a value that is not equal to zero and that is thus a component in the output signal of the lock-in amplifier. Therefore, through the selection of the appropriate frequency of the reference voltage signal, the phase shift between the changed signal of each cell and the reference voltage signal used for all of the cells can be determined.

For each cell, the lock-in amplifier supplies a direct voltage signal whose value provides information about the phase position of the measured alternating voltage relative to the reference voltage signal.

A direct voltage signal of a cell that diverges from other direct voltage signals of other cells means that a phase shift is present here and that the cell might be damaged.

Direct voltage signals that do not diverge from each other indicate that no phase shifts are present and that none of the cells are defective.

In particular, the direct voltage signals are each fed to an analog-to-digital converter where they are converted into a digital output signal. This digital output signal can be fed to an evaluation unit where it is evaluated.

In particular, the reference voltage signal has the frequency of the impressed alternating current. In particular, however, the phase position of the reference voltage signal is not stable with respect to the phase position of the impressed alternating current. Therefore, over the course of time, the alternating voltages of the cells can change relative to the reference voltage signal but not relative to each other, that is to say, relative to the other cells.

As soon as the imaginary portion of the cell resistance of a cell changes, for example, a temperature rise at the start of a thermal propagation, then at all times, this cell has a different alternating voltage or a different phase position from the other cells.

In particular, the frequency and the phase position of the reference voltage signal correspond to the signal of a battery cell that has been filtered through the bandpass filter.

Thus, especially the reference voltage signal can have a shared phase position with the measured alternating voltages of the cells, especially of the non-defective cells.

The reference voltage signal is especially generated from the bandpass-filtered signal of the measured alternating voltage of a cell. An amplifier converts this signal into a changed signal and it is used as the reference voltage signal.

In particular, the signal of a cell that is used for the reference voltage signal and filtered through the bandpass filter is shifted in terms of its phase position so that, as a phase-shifted signal of a cell, it forms the reference voltage signal of the lock-in amplifier.

In particular, a phase shifter is provided with which the reference voltage signal can be shifted in terms of its phase position. The phase shifter can change the phase position of the reference voltage signal and can thus amplify only the imaginary portion of the voltage (and thus of the resistance). As a result, a voltage difference between the alternating voltages of the cells can be more effectively established.

In particular, the alternating voltages measured at the cells are each filtered through a bandpass filter and each signal thus generated is changed by an amplifier, wherein each of the changed signals of two cells is fed to a differential amplifier. Every cell is connected to every other cell that is connected in a series connection, in each case, via a differential amplifier. The differential amplifier only generates a measured signal when a phase shift is present between the changed signals of the two cells.

Therefore, the cells arranged consecutively in the series connection are especially each connected to the preceding cell as well as to the subsequent cell, in each case, via a differential amplifier.

This measured signal can be fed to an analog-to-digital converter where it can be converted into a digital output signal. This digital output signal can be fed to an evaluation unit where it is evaluated.

A data processing system is being proposed that is equipped, configured or programmed to carry out the described method, wherein the data processing system processes phase positions of alternating voltages that have been measured at a plurality of cells of a battery and it compares them to each other.

Moreover, the method can also be carried out by a computer or with a processor of a control unit.

The method can especially be implemented in a control device or in a control unit, wherein the control device is provided at least to diagnose, and optionally also to operate, the battery.

The battery can be used in a motor vehicle for storing energy, wherein at least one traction drive of the motor vehicle is supplied with electric energy via the battery.

In particular, a motor vehicle having a traction drive and the described battery as well as the data processing system is being proposed.

A machine-readable storage medium can be provided that comprises commands that—if they are being executed by a computer/processor—cause the computer/processor to carry out the method or at least some of the steps of the proposed method.

The explanations about the method can especially be applied to the motor vehicle, to the battery and/or to the computer-implemented method (that is to say, the computer or the processor, the data processing system, the machine-readable storage medium) and vice versa.

In particular, when it comes to the proposed method or the data processing system, no synchronization line is needed between the current excitation and the voltage measurement since the phase position relative to the current is not needed.

The circuits or data processing systems suitable for carrying out the method are especially robust against interferences.

In particular, no additional intelligence ($\mu C$) is needed for evaluating the measured values that have been acquired with the method.

The time for carrying out the method or the time in which the alternating current is impressed is very short, e.g. at least one second, especially less than two seconds. In this manner, it can be ensured that only a small amount of energy is being withdrawn from the at least one cell or from the battery.

A consumer that is already present in the motor vehicle, for example, a high-voltage heater, a pulse width modulated inverter or a heating mat controller can be used in order to impinge the alternating current. By the same token, the changing current of the electric drive can serve as a signal source.

The use of indefinite articles ("a", "an"), especially in the claims and in the description that explains the claims, is to be understood as such and not as numerals. Accordingly, terms or components introduced with these indefinite articles should be construed in such a way that they are present at least once but especially, they can also be present multiple times.

For the sake of clarity, it should be pointed out that the ordinal numbers used here ("first", "second", etc.) serve primarily (only) to differentiate among several similar object, quantities or processes, in other words, they do not necessarily prescribe any relationship and/or sequence of these objects, quantities or processes relative to each other. If a relationship and/or a sequence is required, then this is indicated explicitly here or else it is obvious to the person skilled in the art who studies the embodiment being concretely described. Insofar as a component can be present multiple times ("at least one"), the description of one of these components can apply equally to all or to some of the plurality of these components, although this does not absolutely have to be the case.

BRIEF DESCRIPTION OF THE DRAWINGS

The invention as well as the technical field will be described in greater detail below on the basis of the accompanying figures. It should be pointed out that the invention is not to be construed as being restricted to the embodiments presented. In particular, unless expressly indicated otherwise, it is also possible to extract partial aspects of the situations elucidated in the figures and to combine them with other components and insights stemming from the present description. In particular, it should be pointed out that the figures and especially the size relationships shown are purely of a schematic nature. The following is shown.

DETAILED DESCRIPTION OF THE INVENTION

Figure 1:
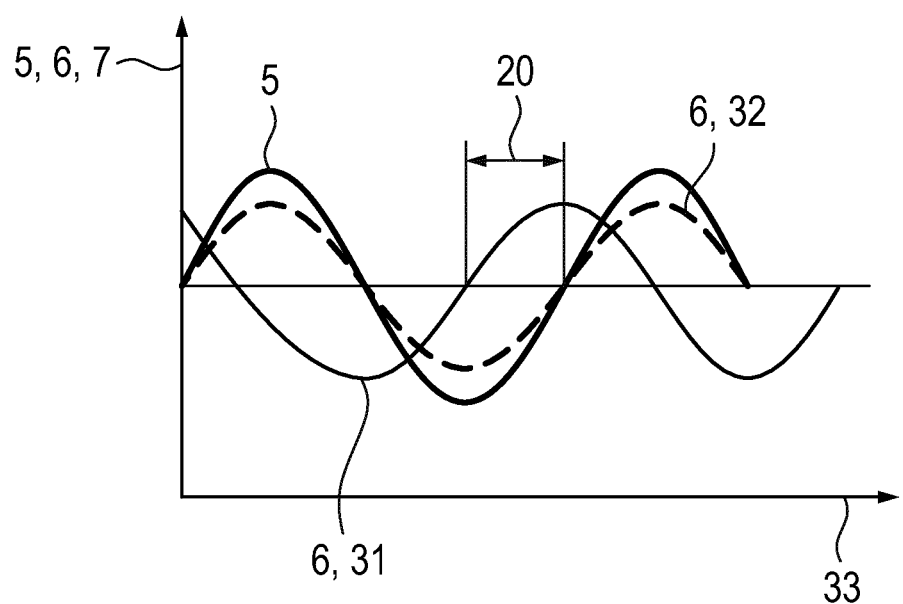
FIG. 1 a diagram.

FIG. 1 shows a diagram. The alternating current 5 and the alternating voltage 6, 7 are plotted on the vertical axis. The time 33 is plotted on the horizontal axis. The curves of the alternating current 5 and a first alternating voltage 6 are shown. The first alternating voltage 6 comprises an imaginary portion 31 and a real portion 32. The imaginary portion 31 exhibits a phase shift relative to the real portion 32.

One method for directly measuring the internal cell temperature is so-called impedance spectroscopy. In impedance spectroscopy, a phase relationship between the current 5 and the voltage 6, 7 is evaluated and used to determine the real portion 32 or the imaginary portion 31 of a cell resistance. This takes place in that the frequency response of an impressed current 5 passes from very low frequencies (0.1 Hz) to high frequencies (10 kHz). This method is very time-consuming and a great deal of energy is withdrawn from the cell 1, 2, 3 in order to impress the current 5. Moreover, interferences that are caused by the consumers of the motor vehicle have a strong effect and falsify the measured signal. The measured results of the voltage 6 and the current 5 are evaluated by complex algorithmics. In this context, a conclusion can then be drawn, for example, about the absolute value of the internal cell temperature. This method is very susceptible to interference and is only used under laboratory conditions nowadays.

With the method described here, which can also be referred to as "differentially measuring impedance spectroscopy", only the difference between the imaginary portions 31 of the cell resistances relative to each other are determined. In particular, here it is not the phase relationship between a current 5 and a voltage 6 that is evaluated, but rather only the phase position 8, 9 or phase relationship of the alternating voltages 6, 7 relative to each other that have been measured at the cells 1, 2, 3. Possible interferences of the current signal have an effect simultaneously and with the same magnitude on all of the cells 1, 2, 3 of the battery 4 or of the series-connected cells 1, 2, 3 and are not measured here as a common mode portion. In the present method, exclusively changes in the imaginary portions 31 of the cell resistances relative to each other are measured and evaluated.

The circuits 41, 42, 43, 44 shown in FIGS. 2 through 5 represent data processing systems that are configured to be suitable to carry out the method. Reference is hereby made to the explanations pertaining to FIG. 1.

Figure 2:
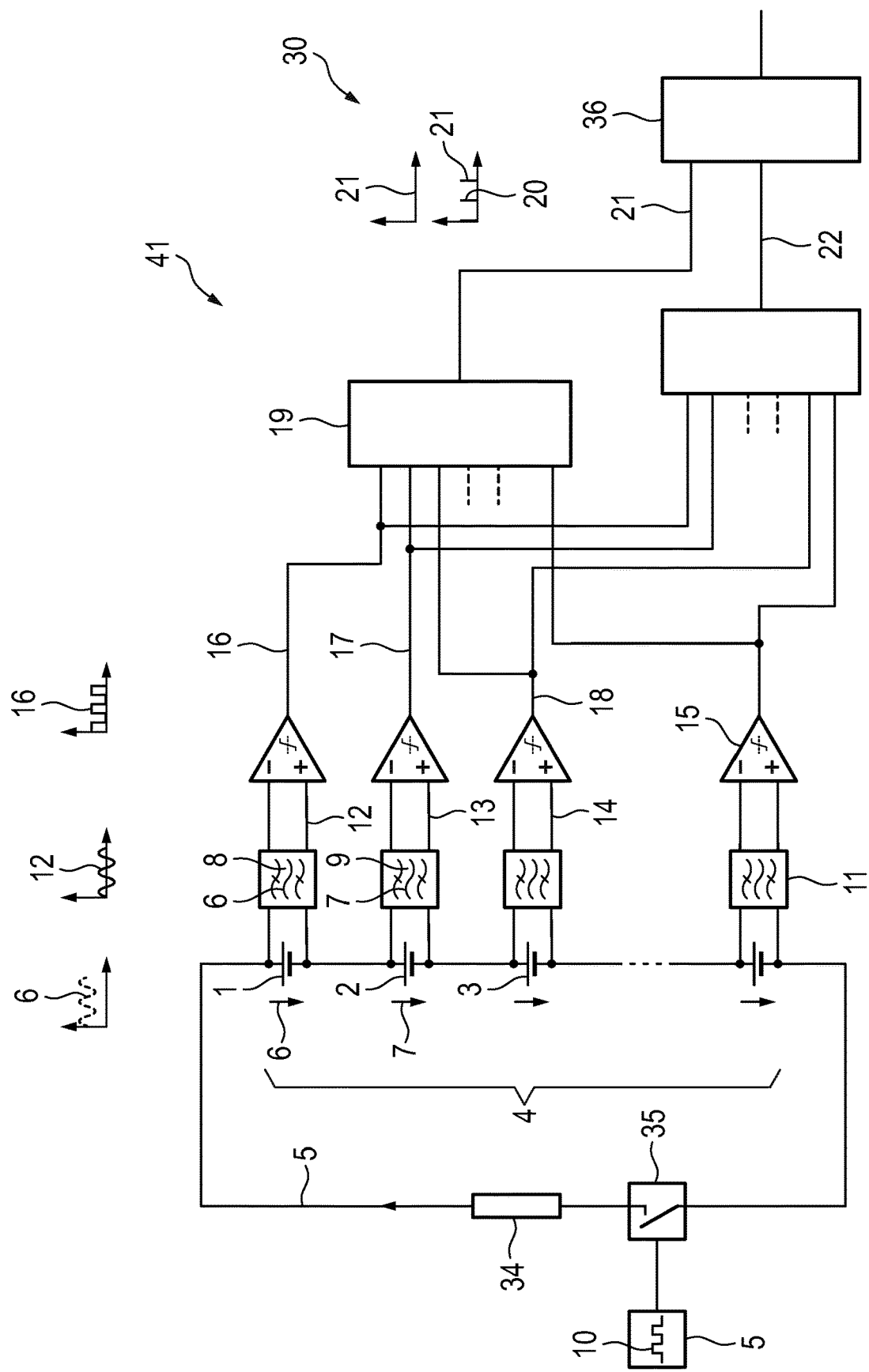
FIG. 2 a first circuit.

FIG. 2 shows a first circuit 41. The first circuit 41 makes it possible to carry out the method for determining a state of at least one cell 1, 2, 3 of a battery 4, wherein the battery 4 has a plurality of cells 1, 2, 3 to n, which are connected in series with each other. According to step a), an alternating current 5 is applied to the plurality of cells 1, 2, 3. According to step b), the alternating voltage 6, 7 produced thereby is measured at at least a first cell 1 and a second cell 2 (and at the other cells, for example, the third cell 3 through cell n). According to step c), a phase position 8, 9 of the measured alternating voltage 6, 7 of each cell 1, 2, 3 is analyzed. A difference at least between a first phase position 8 of a first alternating voltage 6 measured at the first cell 1 and a second phase position 9 of a second alternating voltage 7 measured at the second cell 2 forms a conclusion about a difference between the states of at least the first cell 1 and the second cell 2.

According to step a), an alternating current 5, for example, at a frequency 10, is impressed into the cells 1, 2, 3 of the battery 4. For this purpose, the circuit has a switch 35 and a consumer 34 that is operated by the impressed alternating current 5.

The alternating voltages 6, 7 measured at the cells 1, 2, 3 are each filtered through a bandpass filter 11 and the signal 12, 13, 14 thus generated is changed by an amplifier 15 having a comparator. The first signal 12 is a bandpass-filtered first alternating voltage 6 that has a first phase position 8 and that was measured at the first cell 1. The second signal 13 is the bandpass-filtered second alternating voltage 7 that has a second phase position 9 and that was measured at the second cell 2. The third signal 14 is the correspondingly filtered alternating voltage of the third cell 3. The signals 16, 17, 18 changed by the amplifier 15 having the comparator are combined in a phase detector 19. The first changed signal 16 is based on the first signal 13 [sic], the second changed signal 17 is based on the second signal 13, and the third changed signal 18 is based on the third signal

14. A phase shift 20 of the measured alternating voltages 6, 7 can be represented by a first output signal 21.

The bandpass filter 11 can be used to detect the alternating voltage 6, 7 that is to be associated with the impressed alternating current 5 and that is thus generated at the cell 1, 2, 3. Therefore, the bandpass filter 11 especially allows the detection of an alternating voltage 6, 7 that has the frequency 10 of the alternating current 5.

The amplifier 15 having the comparator supplies a changed signal 16, 17, 18 that represents—as a square-wave signal—the alternating voltage 6, 7 that has been measured and filtered through the bandpass filter 11. If a phase shift 20 relative to other alternating voltages 7, 6 is present, then this becomes clear through a shift of the square-wave signals along the time axis (see representation of the first output signals 21 in the diagrams).

The signals 16, 17, 18 changed by the amplifier 15 having the comparator are represented as a second output 22 signal, so that it is possible to represent which alternating voltage 6, 7 or alternating voltages 6, 7 have a phase shift 20 relative to other alternating voltages 7, 6.

As soon as the imaginary portions 31 of the cell resistances differ and thus generate a phase shift 20 of the alternating voltage 6, 7 measured at a cell 1, 2, 3, the first output signal 21 generates a square-wave signal. This allows a conclusion to be drawn about a difference among the cells 1, 2, 3, for example, about a temperature rise at the start of a thermal propagation. The length of the square-wave signal in terms of time is especially proportional or equal to the magnitude of the difference, that is to say, for example, the temperature difference (see representation of the first output signals 21 in the diagrams, the upper diagram does not show any perceptible first output signals 21, the lower diagram shows rectangular first output signals 21 that indicate the presence of a phase shift 20).

The output signals 21, 22 are evaluated by an evaluation unit 36.

Figure 3:
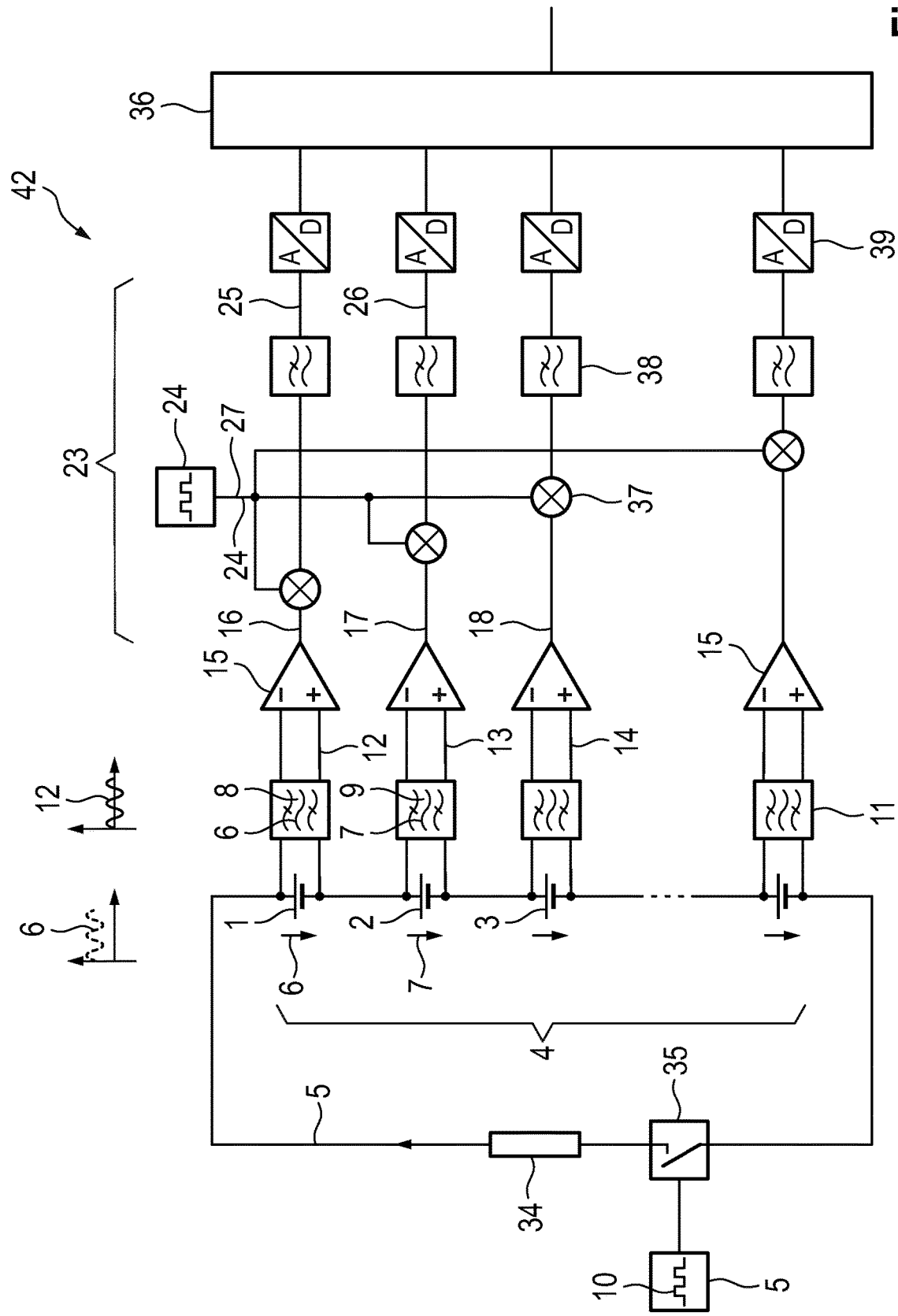
FIG. 3 a second circuit.

FIG. 3 shows a second circuit 42. Reference is hereby made to the explanations pertaining to FIG. 2. In contrast to the first circuit 41, the changed signals 16, 17, 18 are each fed to a lock-in amplifier 23 that is impinged with a reference voltage signal 24, wherein, for each measured alternating voltage 6, 7, the lock-in amplifier 23 outputs a direct voltage 25, 26 whose magnitude is proportional at least to a phase shift 20 between the measured alternating voltage 6, 7 and the reference voltage signal 24.

The amplifier 15 supplies a changed signal 16, 17, 18 that represents—as a square-wave signal—the alternating voltage 6, 7 that has been measured and filtered through the bandpass filter 11.

The reference voltage signal 23 is likewise a square-wave signal. The reference voltage signal 23 has the same frequency 10 as the impressed alternating current 5.

A lock-in amplifier 23 is an amplifier for measuring a weak electric alternating signal, here the changed signal 16, 17, 18, that is modulated with a reference voltage signal 24 whose frequency 10 and phase position are known. The device comprises a narrow-band bandpass filter and consequently improves the signal-to-noise ratio (SNR).

The two input signals of the appertaining lock-in amplifier 23, that is to say, the measured alternating voltage 6, 7 that was filtered in the bandpass filter 11 and that was converted into a changed signal 16, 17, 18 by means of an amplifier 15 on the one hand, and the reference voltage signal 24 on the other hand, are multiplied by each other in a mixer 37 or multiplicator and subsequently integrated into a low-pass filter 38. The low-pass filter 38 permits the masking of signals having higher frequencies 10 that are generated when the input signals are multiplied.

The appertaining lock-in amplifier 23 computes the cross-correlation between the changed signal 16, 17, 18 and the reference voltage signal 24 for a fixed phase shift 20 between the changed signal 16, 17, 18 of a cell 1, 2, 3 and the reference voltage signal 24. For each cell 1, 2, 3, the lock-in amplifier 23 supplies a direct voltage signal 25, 26—here a first direct voltage signal 25 for the first cell 1 and a second direct voltage signal 26 for the second cell 2—whose value provides information about the phase position 8, 9 of the measured alternating voltage 6, 7 relative to the reference voltage signal 24.

A direct voltage signal 26, 25 of a cell 1, 2, 3 that diverges from other direct voltage signals 25, 26 of other cells 3, 2, 1 means that a phase shift 20 is present here and that the cell 1, 2, 3 might be damaged.

Direct voltage signals 25, 26 that do not diverge from each other indicate that no phase shifts 20 are present and that none of the cells 1, 2, 3 are defective.

The direct voltage signals 25, 26 are each fed to an analog-to-digital converter 39 where they are converted into a digital output signal. This digital output signal can be fed to an evaluation unit 36 where it is evaluated.

Figure 4:
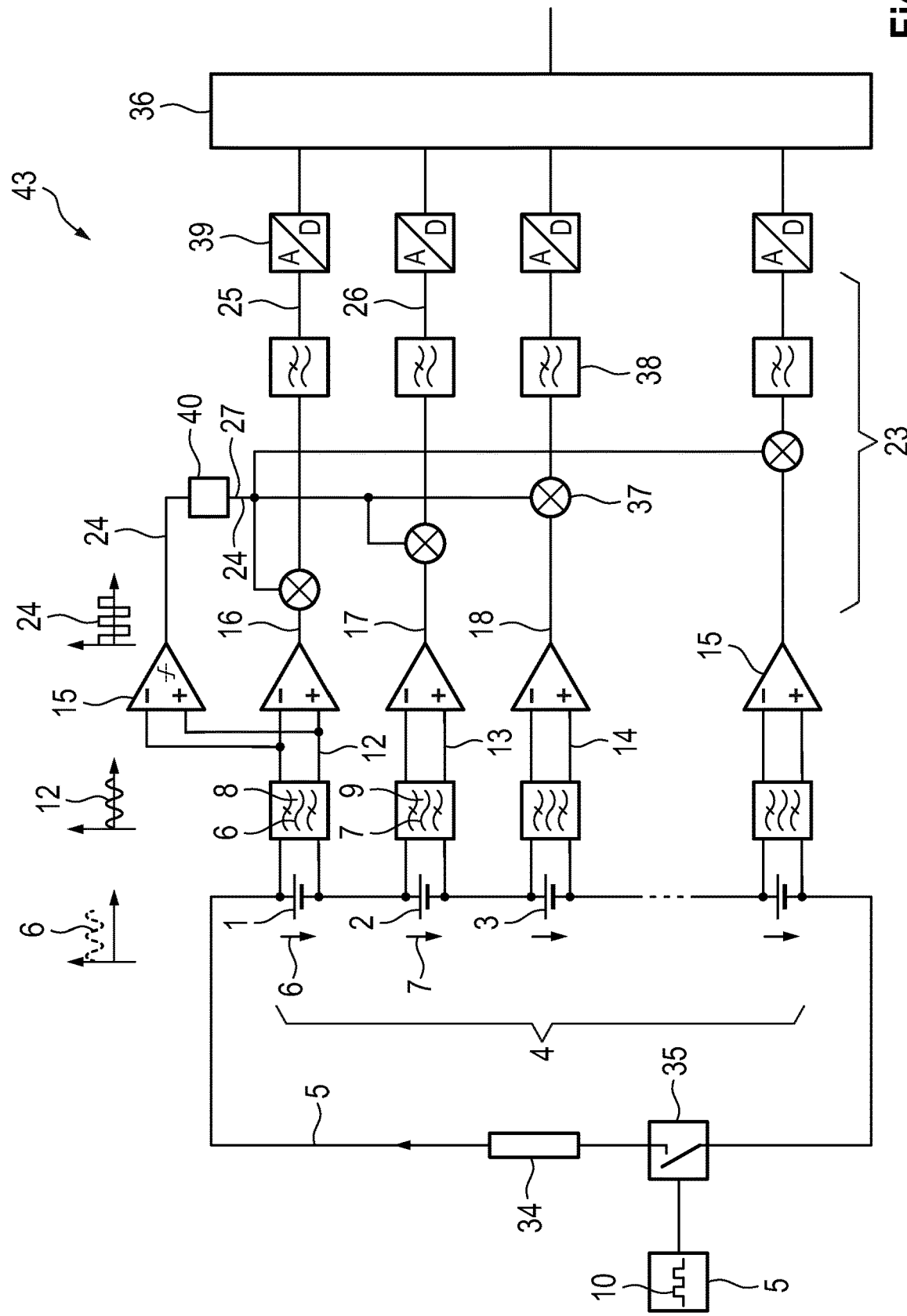
FIG. 4 a third circuit.

FIG. 4 shows a third circuit 43. Reference is hereby made to the explanations pertaining to FIGS. 2 and 3. In contrast to the second circuit 42, the frequency 10 and the phase position 8, 9 of the reference voltage signal 24 correspond to the signal of the first cell 1 of the battery 4 that has been filtered through the bandpass filter 11. Thus, the reference voltage signal 24 can have a shared first phase position 8 with the measured alternating voltage 6 of the first cell 1.

The reference voltage signal 24 is generated from the bandpass-filtered first signal 12 of the measured first alternating voltage 6 of the first cell 1. An amplifier 15 converts this first signal 12 into a changed signal and it is used as the reference voltage signal 24. The first signal 12 of the first cell 1 that is used for the reference voltage signal 24 and filtered through the bandpass filter 11 is shifted in terms of its phase position 20 so that, as a phase-shifted signal 27 of the first cell 1, it forms the reference voltage signal 24 of the lock-in amplifier 23.

For this purpose, a phase shifter 40 is provided with which the reference voltage signal 24 can be shifted in terms of its phase position 8, 9. The phase shifter 40 can change the phase position 8, 9 of the reference voltage signal 24 and can thus amplify only the imaginary portion 31 of the voltage (and thus of the resistance).

Figure 5:
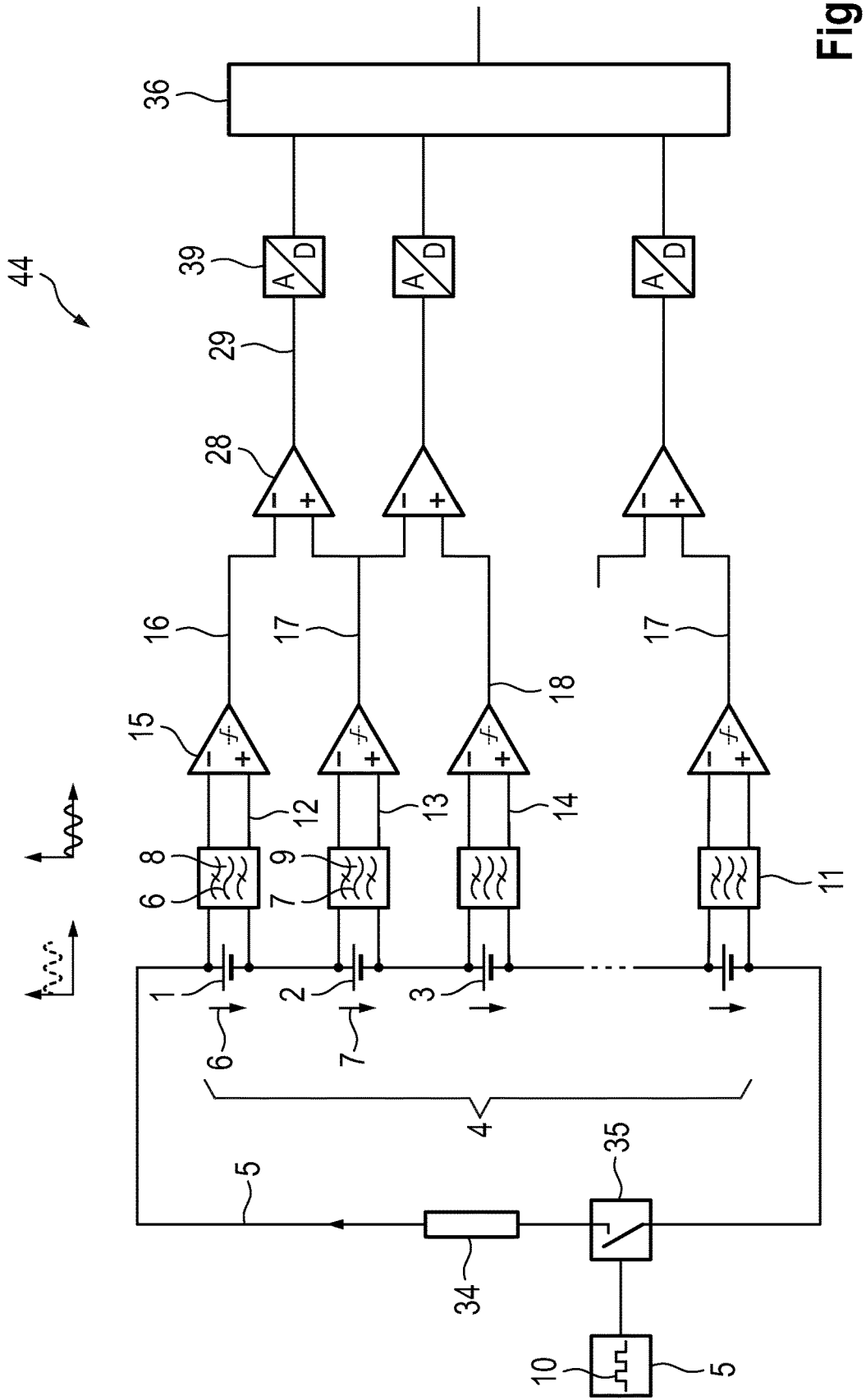
FIG. 5 a fourth circuit.

FIG. 5 shows a fourth circuit 44. Reference is hereby made to the explanations pertaining to FIGS. 2 through 4. In contrast to the second circuit 42, all of the changed signals 16, 17, 18 of two cells—here the first cell 1 and the second cell 2 as well as the second cell 2 and the third cell 3—are each fed to a differential amplifier 28. Every cell 1, 2, 3 is connected to every other cell 3, 2, 1 that is connected in the series connection, in each case, via a differential amplifier 28. The differential amplifier 28 only generates a measured signal 29 when a phase shift 20 is present between the changed signals 16, 17, 18 of the two cells 1, 2, 3 that are each connected via the differential amplifier 28.

This measured signal 29 is fed to an analog-to-digital converter 39 where it can be converted into a digital output signal. These digital output signals are fed to an evaluation unit 36 where they are evaluated.

LIST OF REFERENCE NUMERALS

1 first cell
2 second cell 3 third cell
4 battery
5 alternating current
6 first alternating voltage
7 second alternating voltage
8 first phase position
9 second phase position
10 frequency
11 bandpass filter
12 first signal
13 second signal
14 third signal
15 amplifier
16 first changed signal
17 second changed signal
18 third changed signal
19 phase detector
20 phase shift
21 first output signal
22 second output signal
23 lock-in amplifier
24 reference voltage signal
25 first direct voltage
26 second direct voltage
27 phase-shifted signal
28 differential amplifier
29 measured signal
30 data processing system
31 imaginary portion
32 real portion
33 time
34 consumer
35 switch
36 evaluation unit
37 mixer
38 low-pass filter
39 converter
40 phase shifter
41 first circuit
42 second circuit
43 third circuit
44 fourth circuit

The invention claimed is:

1. A method for determining a state of at least one cell of a battery, wherein the battery has a plurality of cells that are connected in series with each other, the method comprising at least the following steps:
  a) applying an alternating current to the plurality of cells;
  b) measuring the alternating voltage produced thereby at at least a first cell and a second cell; and
  c) analyzing a phase position of the measured alternating voltage of each cell;
  wherein a difference at least between a first phase position of a first alternating voltage measured at the first cell and a second phase position of a second alternating voltage measured at the second cell forms a conclusion about a difference between the states of at least the first cell and the second cell.

2. The method according to claim 1, wherein exclusively the alternating voltages are measured.

3. The method according to claim 1, wherein the alternating current has a constant frequency.

4. The method according to claim 1, wherein the alternating current has a changing frequency.

5. The method according to claim 1, wherein the alternating current has a frequency with just one period length.

6. The method according to claim 1,
  wherein the alternating voltages measured at the cells are each filtered through a bandpass filter, and each signal thus generated is changed by an amplifier having a comparator, and
  wherein the changed signals are each combined in a phase detector, and a phase shift of the measured alternating voltages can be represented by a first output signal.

7. The method according to claim 6, wherein the changed signals are represented as a second output signal, so that it is possible to represent which alternating voltages have a phase shift relative to other alternating voltages.

8. The method according to claim 1,
  wherein the alternating voltages measured at the cells are each filtered through a bandpass filter, and each signal thus generated is changed by an amplifier,
  wherein the changed signals are each fed to a lock-in amplifier that is impinged with a reference voltage signal, and
  wherein, for each measured alternating voltage, the lock-in amplifier outputs a direct voltage whose magnitude is proportional at least to a phase shift between the measured alternating voltage and the reference voltage signal.

9. The method according to claim 8, wherein the frequency and the phase position of the reference voltage signal correspond to the signal of a cell that has been filtered through the bandpass filter.

10. The method according to claim 8, wherein the signal of a cell that is used for the reference voltage signal and filtered through the bandpass filter is shifted in terms of its phase position so that, as a phase-shifted signal of a cell, it forms the reference voltage signal of the lock-in amplifier.

11. The method according to claim 1,
  wherein the alternating voltages measured at the cells are each filtered through a bandpass filter, and each signal thus generated is changed by an amplifier,
  wherein each of the changed signals of two cells is fed to a differential amplifier,
  wherein every cell is connected to every other cell that is connected in a series connection, in each case, via a differential amplifier, and
  wherein the differential amplifier only generates a measured signal when a phase shift is present between the changed signals of the two cells.

12. A data processing system that is equipped, configured or programmed to carry out a method according to claim 1, wherein the data processing system processes phase positions of alternating voltages that have been measured at a plurality of cells of a battery and it compares them to each other.

* * * * *